United States Patent
Ichiriu et al.

(10) Patent No.: US 6,865,098 B1
(45) Date of Patent: Mar. 8, 2005

(54) ROW REDUNDANCY IN A CONTENT ADDRESSABLE MEMORY DEVICE

(75) Inventors: Michael Edwin Ichiriu, Sunnyvale, CA (US); Masaru Shinohara, Fremont, CA (US); YueFei Ge, San Jose, CA (US); Lan Lee, Palo Alto, CA (US)

(73) Assignee: NetLogic Microsystems, Inc., Mountain View, CA (US)

( * ) Notice: Subject to any disclaimer, the term of this patent is extended or adjusted under 35 U.S.C. 154(b) by 6 days.

(21) Appl. No.: 10/449,422

(22) Filed: May 30, 2003

(51) Int. Cl.[7] .............................................. G11C 15/00
(52) U.S. Cl. .................... 365/49; 365/200; 365/189.07
(58) Field of Search ..................... 365/49, 200, 189.07

(56) References Cited

U.S. PATENT DOCUMENTS

| | | | | |
|---|---|---|---|---|
| 5,046,046 A | * | 9/1991 | Sweha et al. .................. | 365/49 |
| 5,311,462 A | * | 5/1994 | Wells ........................... | 365/49 |
| 6,563,754 B1 | * | 5/2003 | Lien et al. ..................... | 365/49 |
| 2004/0105289 A1 | * | 6/2004 | Roth et al. ..................... | 365/49 |

* cited by examiner

*Primary Examiner*—Huan Hoang
(74) *Attorney, Agent, or Firm*—William L Paradice, III

(57) ABSTRACT

A content addressable memory (CAM) has a main array including a plurality of rows of CAM cells, one or more spare rows of CAM cells selectable to functionally replace defective rows of CAM cells in the main array, and a control circuit for disabling the defective rows by writing predetermined data to the defective rows of CAM cells.

50 Claims, 9 Drawing Sheets

ROW REDUNDANCY IN A CONTENT ADDRESSABLE MEMORY DEVICE

FIELD OF INVENTION

This invention relates generally to row redundancy in content addressable memories.

BACKGROUND

A content addressable memory (CAM) device is a storage device having an array of memory cells that can be instructed to compare the specific pattern of a comparand word with data words stored in corresponding rows of the array. During a compare operation, the comparand word is provided to the CAM array and compared with all the CAM words. For each CAM word that matches the comparand word, a corresponding match line is asserted to indicate the match result. If any of the match lines are asserted, a match flag is typically asserted to indicate the match condition, and the address or index of the highest priority matching entry in the CAM array is determined.

Row redundancy has been used to improve the yield of CAM devices. For example, in one prior redundancy scheme for a CAM device that allows a spare row of CAM cells to functionally replace a defective row of CAM cells, each row in the CAM array includes an additional latch dedicated for storing a control bit that, when asserted, disables the row by forcing the row's match line to a mismatch state. Another prior row redundancy scheme for a CAM utilizes valid bits to disable corresponding defective rows. However, these prior redundancy schemes increase the size of the array. Further, if the disabling mechanism (e.g., the dedicated latch or valid bit) for a defective row is also defective, the disabling mechanism may not be able to disable the defective row, which in turn may render the CAM device unusable.

BRIEF DESCRIPTION OF THE DRAWINGS

The features and advantages of the present invention are illustrated by way of example and are by no means intended to limit the scope of the present invention to the particular embodiments shown, and in which.

Like reference numerals refer to corresponding parts throughout the drawing figures.

DETAILED DESCRIPTION

A method and apparatus for performing row redundancy in a CAM device are described below in the context of a CAM device 100 for simplicity only. It is to be understood that embodiments of the present invention may be used for other array architectures. In the following description, for purposes of explanation, specific nomenclature is set forth to provide a thorough understanding of the present invention. However, it will be apparent to one skilled in the art that these specific details may not be required to practice the present invention. In other instances, well-known circuits and devices are shown in block diagram form to avoid obscuring the present invention. Further, the logic levels assigned to various signals in the description below are arbitrary and, thus, may be modified (e.g., reversed polarity) as desired. Additionally, the interconnection between circuit elements or blocks may be shown as buses or as single signal lines. Each of the buses may alternatively be a single signal line, and each of the single signal lines may alternatively be a bus. Accordingly, the present invention is not to be construed as limited to specific examples described herein but rather includes within its scope all embodiments defined by the appended claims.

Embodiments of the present invention improve the yield of CAM devices by allowing defective rows in a CAM array to be functionally replaced by spare rows of CAM cells. For some embodiments, a defective row of CAM cells can be disabled for functional replacement by a spare row of CAM cells by writing predetermined disabling data to one or more of the CAM cells in the defective row. The CAM cells in the defective row that store the disabling data disable the defective row by forcing the row to a mismatch state during compare operations. The ability to implement a row disabling mechanism within the CAM cells of the defective row obviates the need to provide an additional storage element (e.g., a dedicated latch) or a valid bit for each row to disable the row, thereby reducing the array size. For one embodiment, the disabling data is written to all CAM cells in each defective row. In this manner, only one of the CAM cells in a defective row needs to be non-defective to disable the defective row, thereby making row disabling mechanisms of the present invention less vulnerable to defects.

Figure 1:
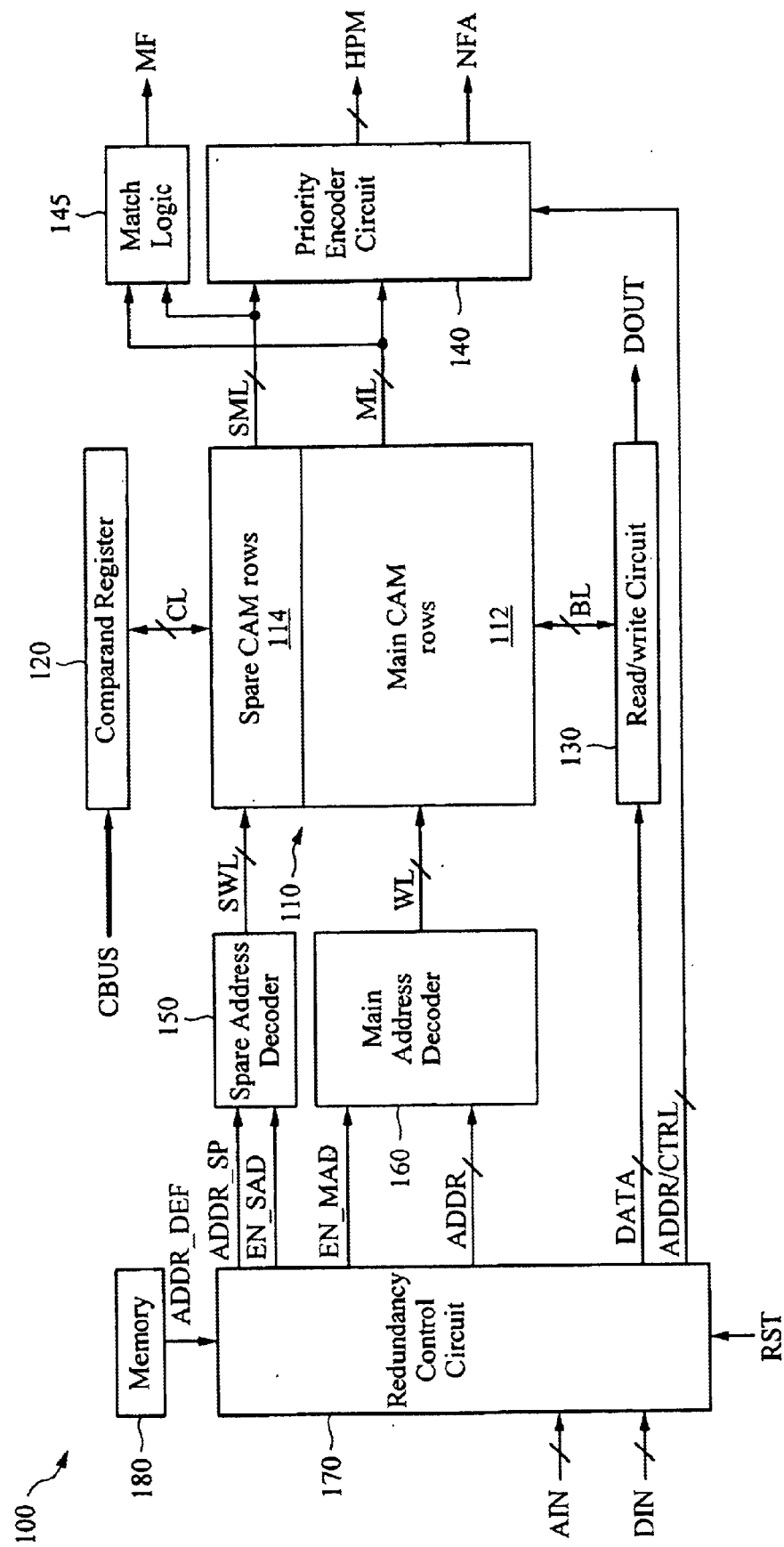
FIG. 1 is a block diagram of a CAM device in accordance with some embodiments of the present invention.

FIG. 1 shows one embodiment of a CAM device 100 in accordance with the present invention. CAM device 100 includes a, CAM array 110, a comparand register 120, a read/write circuit 130, a priority encoder circuit 140, match logic 145, a spare address decoder 150, a main address decoder 160, a redundancy control circuit 170, and a memory element 180. CAM array 110 includes a main CAM array 112 and one or more spare CAM rows 114. Main CAM array 112 includes any number of rows and columns of CAM cells. The spare CAM rows 114 are independent rows of CAM cells that can be enabled to functionally replace rows of CAM cells in main CAM array 112 that have one or more defective CAM cells. For some embodiments, one or more of the CAM cells in each row in main array 112, and one or more of the CAM cells in each spare row 114 are quaternary CAM cells. For other embodiments, all the CAM cells in main array 112 and spare rows 114 are quaternary CAM cells.

One or more instructions and related control signals can be provided to CAM device 100 from an instruction decoder (not shown for simplicity) to control read, write, compare, initialization, and other operations for CAM device 100. Other well-known signals which can be provided to CAM device 100, such as enable signals, clock signals, and power connections, are not shown for simplicity. Further, although not shown in FIG. 1, each row of CAM cells in main CAM array 112 and each spare row 114 can have one or more validity bits to indicate whether the corresponding row (or any segment thereof) of CAM cells stores valid data. In addition, for some embodiments, the rows in main CAM array 112 and spare rows 114 can be divided into a plurality of row segments, for example, to reduce the capacitive loading for each row or to provide multiple width/depth configurations for the array.

Each row of CAM cells in main array 112 is coupled to main address decoder 160 via a corresponding word line WL, and to priority encoder circuit 140 and match logic 145 via a corresponding match line ML. Similarly, each spare row 114 of CAM cells is coupled to spare address decoder 150 via a corresponding spare word line SWL, and to priority encoder circuit 140 and match logic 145 via a corresponding spare match line SML. For simplicity, the word lines and match lines for CAM array 110 are represented collectively in FIG. 1.

Spare address decoder 150 is well-known, and includes circuitry to select a spare row 114 for read, write, or other operations in response to a spare address ADDR_SP provided by control circuit 170. Spare address decoder 150 also includes an input to receive an enable signal EN_SAD from control circuit 170. Main address decoder 160 is well-known, and includes circuitry to select a row of CAM cells in main CAM array 112 in response to an address ADDR provided by control circuit 170. Main address decoder 160 also includes an input to receive an enable signal EN_MAD from control circuit 170. For some embodiments, each enable signal EN_SAD and EN_MAD can be gated with read and write enable signals to activate spare address decoder 150 and main address decoder 160 only during read and write operations.

The match lines ML and spare match lines SML provide match results for compare operations between comparand data (e.g., a search key) and words stored in main CAM array 112 and spare CAM rows 114, respectively, to priority encoder circuit 140. In response thereto, priority encoder circuit 140 determines the matching entry that has the highest priority number associated with it and generates the index or address of this highest priority match (HPM). In addition, priority encoder circuit 140 can use the validity bits from CAM array 110 to generate the next free address (NFA) that is available in CAM array 110 for storing new data. Although not shown in FIG. 1, for some embodiments, priority encoder circuit 140 provides NFA and/or HPM to control circuit 170. For some embodiments, priority encoder circuit 140 is of the type described in commonly owned U.S. Pat. No. 6,275,426, which is incorporated herein by reference.

Match logic 145 is well-known, and uses the match results from CAM array 110 to generate a match flag MF indicative of a match condition, and can generate a multiple match flag to indicate multiple matches. In addition, match logic 145 can use the validity bits from CAM array 110 to assert a full flag when all of the rows of CAM cells in CAM array 110 are filled with valid entries.

Each column of CAM cells in CAM array 110 is coupled to comparand register 120 via comparand lines CL and to read/write circuit 130 via bit lines BL. For simplicity, the comparand lines CL and bit lines BL are represented collectively in FIG. 1. Comparand register 120 is well-known, and can be configured to receive comparand words from a comparand bus CBUS. For other embodiments, comparand data can be provided to CAM array 110 via another bus and/or circuit. Read/write circuit 130 includes well-known write drivers to write input data DATA to CAM array 110, and includes well-known sense amplifiers to read output data DOUT from CAM array 110. For other embodiments, DATA and DOUT may be provided on the same bus.

Memory element 180 includes one or more storage locations, each to store an address of a defective row in main CAM array 112 that a corresponding spare row 114 is to functionally replace. For some embodiments, each storage location in memory element 180 also includes a disable bit that indicates whether the row in main CAM array 112 identified by the defective address is to be disabled and functionally replaced by the corresponding spare row 114. Memory element 180 may be any suitable storage device. For some embodiments, memory element 180 is a fuse bank. For other embodiments, memory element 180 is a non-volatile memory device such as, for example, EPROM, EEPROM, or flash memory. For other embodiments, memory element 180 may be eliminated, and the defective row addressees) may be stored in a suitable external memory device and provided to CAM device 100 during initialization, reset, or other operations.

Redundancy control circuit 170, which controls the functional replacement of defective rows in main CAM array 112 with spare rows 114, includes inputs to receive an input address AIN, input data DIN, a reset signal RST, and one or more defective addresses ADDR_DEF from memory element 180. Control circuit 170 includes outputs to provide ADDR to main address decoder 160, ADDR_SP to spare address decoder 150, and DATA to read/write circuit 130. Control circuit 170 also includes an output to provide defective address and control information to priority encoder circuit 140, and includes outputs to provide EN_SAD to spare address decoder 150 and EN_MAD to main address decoder 160. For some embodiments, EN_SAD is the logical complement of EN_MAD.

Figure 2:
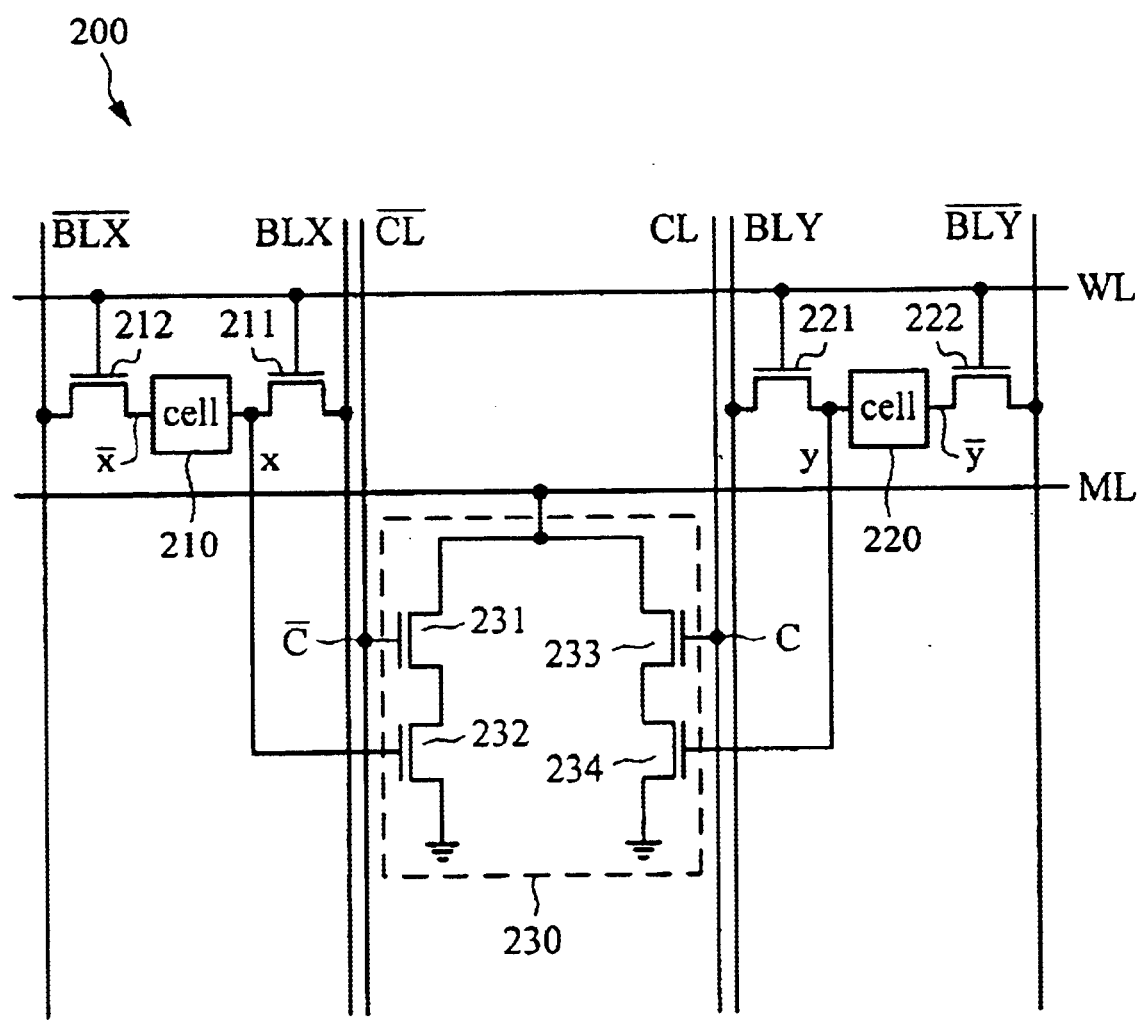
FIG. 2 is a circuit diagram of one embodiment of the CAM cells employed in the array of FIG. 1.

FIG. 2 shows one embodiment of the quaternary CAM cells 200 used in CAM array 110. CAM cell 200 includes a first storage cell 210 that stores a first bit X, a second storage cell 220 that stores a second bit Y, and a compare circuit 230. Storage cells 210 and 220 can be any suitable storage element including, for example, a Static Random Access Memory (SRAM) cell, a Dynamic RAM (DRAM) cell, and the like. Storage cell 210 includes a data output to provide X to a first bit line BLX via NMOS pass transistor 211, and includes a complementary data output to provide $\overline{X}$ to a first complementary bit line $\overline{BLX}$ via NMOS pass transistor 212. Storage cell 220 includes a data output to provide Y to a second bit line BLY via NMOS pass transistor 221, and includes a complementary data output to provide $\overline{Y}$ to a second complementary bit line $\overline{BLY}$ via NMOS pass transistor 222. The gates of pass transistors 211–212 and 221–222 are coupled to word line WL.

Compare circuit 230 includes NMOS transistor pairs 231–232 and 233–234 each connected in series between match line ML and ground potential. For some embodiments, match line ML is pre-charged (e.g., toward $V_{DD}$) for compare operations by a well-known pre-charge circuit (not shown). The gate of transistor 233 is responsive to a comparand bit C provided on a comparand line CL, the gate of transistor 234 is responsive to Y, the gate of transistor 231 is responsive to a complementary comparand bit $\overline{C}$ provided on a complementary comparand line $\overline{CL}$, and the gate of transistor 232 is responsive to X.

The X and Y bits are written to and read from cells 210 and 220, respectively, using read/write circuit 130 in a well-known manner. The X and Y bits can each be either logic high (i.e., a "1") or logic low (i.e., "0"), and collectively represent four possible logic states for a data bit D stored by CAM cell 200. For one embodiment, the four logic states of D as represented by X and Y are summarized in table 1 below.

TABLE 1

| X | Y | D |
|---|---|---|
| 0 | 0 | always match |
| 0 | 1 | 0 |
| 1 | 0 | 1 |
| 1 | 1 | always mismatch |

The "0" and "1" states for D correspond to the logic states represented, for example, by a conventional binary CAM cell. For each of these states, if the comparand data matches the data stored in CAM cell 200, compare circuit 230 does not discharge ML, which indicates the match condition. Conversely, if the comparand data does not match the data stored in CAM cell 200, compare circuit 230 discharges ML (e.g., toward ground potential) to indicate the mismatch condition. For the "always match" state, the logic low values for X and Y maintain respective transistors 232 and 234 in non-conductive states, thereby preventing compare circuit 230 from discharging ML. In this manner, data stored in CAM cell 200 is masked from the compare operation, thereby forcing a match condition for CAM cell 200, regardless of the comparand data. In this state, the cells 210 and 220 effectively store a don't care state. For the "always mismatch" state, the logic high values for X and Y maintain respective transistors 232 and 234 in conductive states. During a compare operation, at least one of C or $\overline{C}$ will be logic high, and compare circuit 230 discharges ML to indicate the mismatch state. Thus, for some embodiments, a predetermined disabling data value of XY=11 can be written to one or more CAM cells 200 in a defective row of main CAM array 112 to force the defective row to a mismatch state during compare operations, thereby disabling the defective row for functional replacement by a spare row 114.

For other embodiments, other quaternary CAM cells that are capable of storing four states of information (i.e., match on logic low, match on logic high, always match, and always mismatch) can be used in CAM array 110. Thus, the embodiment of FIG. 2 is merely exemplary, and does not limit the scope of the present invention.

Spare rows 114 can be programmed to replace defective rows of CAM cells in main CAM array 112 as follows. Initially, main CAM array 112 is tested using any generally known testing methodology and hardware to determine if any of the CAM cells in main CAM array 112 are defective. For each row that contains one or more defective CAM cells, the address of the defective row is programmed into an available location of memory element 180, and the corresponding disable bit in memory element 180 is asserted (e.g., to logic high). For some embodiments, defective addresses can be stored in memory element 180 in any order.

When CAM device 100 is powered for normal operation after initial testing, the reset signal RST is asserted (e.g., to logic high) to reset CAM device 100 to a known state. If programmed with one or more defective addresses, memory element 180 provides the defective address(es) to control circuit 170. In response thereto, control circuit 170 disables each defective row by writing the disabling data (e.g., XY=11) to one or more CAM cells 200 in each defective row. As discussed above, storing the disabling data in one or more CAM cells 200 of a defective row forces the defective row to a mismatch state during compare operations. For some embodiments, control circuit 170 also writes the disabling data to spare rows 114 that do not functionally replace defective rows in main CAM array 112, thereby disabling any unused spare rows 114.

The disabling data can be written to any number of CAM cells 200 in a defective row to disable the row. For one embodiment, the disabling data is written to only one CAM cell 200 in each defective row. For other embodiments, the disabling data is written to all CAM cells 200 in a defective row so that only one of the CAM cells 200 in the defective row needs to be non-defective to disable the row. In this manner, row disabling mechanisms of the present invention are not as vulnerable to defects as prior CAM row redundancy techniques.

Further, by writing disabling data to one or more CAM cells in a defective row to disable the defective row, embodiments of the present invention implement the row disabling mechanism within the CAM cells of the defective row, thereby eliminating the need for each row to include an additional storage element(s) (e.g., a latch or valid bit) dedicated to selectively disable the row, which in turn reduces array size. Accordingly, for some embodiments, the CAM cells 200 in each row of main CAM array 112 can be used both for storing corresponding bits of a data word and for implementing row redundancy for the array. For other embodiments, an additional bit such as, for example, a valid bit, can be used to disable each row during compare operations, or one or more additional quaternary bits can be added to the row of CAM cells for disabling purposes.

After the defective row(s) in main CAM array 112 are disabled, subsequent reads and writes to the defective rows will instead access corresponding spare rows 114. For example, a read or write operation to a-defective row in main CAM array 112 is performed as follows. The read or write address AIN is provided to control circuit 170. AIN can be provided externally from another device or user, or internally, for example, as the NFA, the highest priority address, or a burst address. Control circuit 170 compares AIN to the defective addresses provided by memory element 180. If there is not a match, which indicates that the row addressed by AIN is not defective, control circuit 170 disables spare address decoder 150 and enables main address decoder 160 (e.g., by de-asserting EN_SAD and asserting EN_MAD, respectively). Control circuit 170 also provides AIN to main address decoder 160, which in turn selects the row in main CAM array 112 addressed by ADDR for the read or write operation. Data is then read from or written to the selected row in main CAM array 112 in a conventional manner.

Conversely, if there is a match between AIN and a defective address provided by memory element 180, which indicates that the row addressed by AIN is defective and is to be replaced by a corresponding spare row 114, control circuit 170 enables spare address decoder 150 and disables main address decoder 160 (e.g., by asserting EN_SAD and de-asserting EN_MAD, respectively). Control circuit 170 also outputs the spare address ADDR_SP of the spare row 114 that is to functionally replace the defective row in main CAM array 112. In response to ADDR_SP, spare address decoder 150 selects a spare row 114 for the read or write operation. Data is then read from or written to the selected spare row 114 in a conventional manner.

Figure 3:
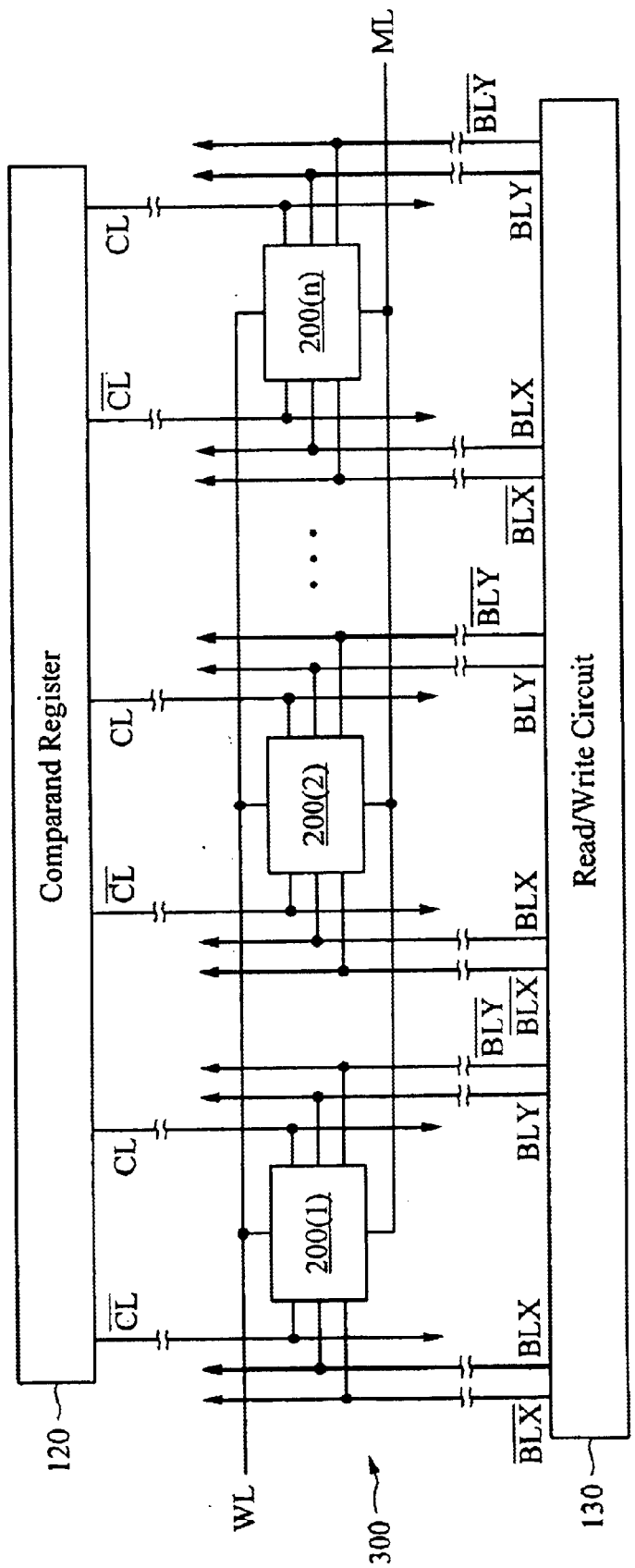
FIG. 3 is a block diagram of an exemplary row for the array of FIG. 1.

FIG. 3 shows an exemplary row 300 that can be used for rows in main CAM array 112. For some embodiments, row 300 can be also used for spare rows 114. Row 300 includes n CAM cells 200(1)–200(n) that can be used to store an n-bit word or to store disabling data for the row. The CAM cells 200 in row 300 are each coupled to a match line ML and to a word line WL. Each column of CAM cells 200 in row 300 is coupled to bit line pairs BLX/$\overline{BLX}$ and BLY/$\overline{BLY}$, and to a comparand line pair CL/$\overline{CL}$. The bit line pairs BLX/$\overline{BLX}$ and BLY/$\overline{BLY}$ are each coupled to read/write circuit 130, and the comparand line pair CL/$\overline{CL}$ is coupled to comparand register 120.

For read and write operations, main address decoder 160 (or spare address decoder 150) selects CAM cells 200 of row 300 by asserting word line WL (e.g., to logic high). Bit line pairs BLX/$\overline{BLX}$ read the X bits from or write the X bits to storage cells 210 in corresponding CAM cells 200, and bit line pairs BLY/$\overline{BLY}$ read the Y bits from or write the Y bits to storage cells 220 in corresponding CAM cells 200 (storage cells 210 and 220 are not shown in FIG. 3 for simplicity).

For compare operations, comparand line pair CL/$\overline{CL}$ provides the comparand data to CAM cells 200 for comparison with data stored in row 300, and match line ML provides the match results to priority encoder circuit 140 (not shown in FIG. 3). Match line ML, which for some embodiments, is pre-charged for the compare operation, indicates a match condition for row 300 only if all CAM cells 200 in the row match the comparand data. For example, match line ML remains in its pre-charged logic high state to indicate the match condition if all CAM cells 200 in row 300 either (1) match the comparand data or (2) are masked (e.g., by setting the CAM-cell 200 to the "always match" state). Conversely, match line ML is discharged toward ground potential to indicate the mismatch state if any CAM cell 200 in row 300 either (1) does not match the comparand word or (2) stores the disabling data (e.g., by setting the CAM cell 200 to the "always mismatch" state).

For alternate embodiments, other CAM array architectures may be used. For example, in some embodiments, CAM array 110 may not include complementary comparand lines CL and $\overline{CL}$, in which case the complementary bit lines BLX/$\overline{BLX}$ or BLY/$\overline{BLY}$ can be coupled to comparand register 120 and be used to perform a compare operation as is generally known in the art. For some embodiments, a single bit line pair can be shared for each column. For other embodiments, each row can have separate word lines cells 210 and 220.

Figure 4:
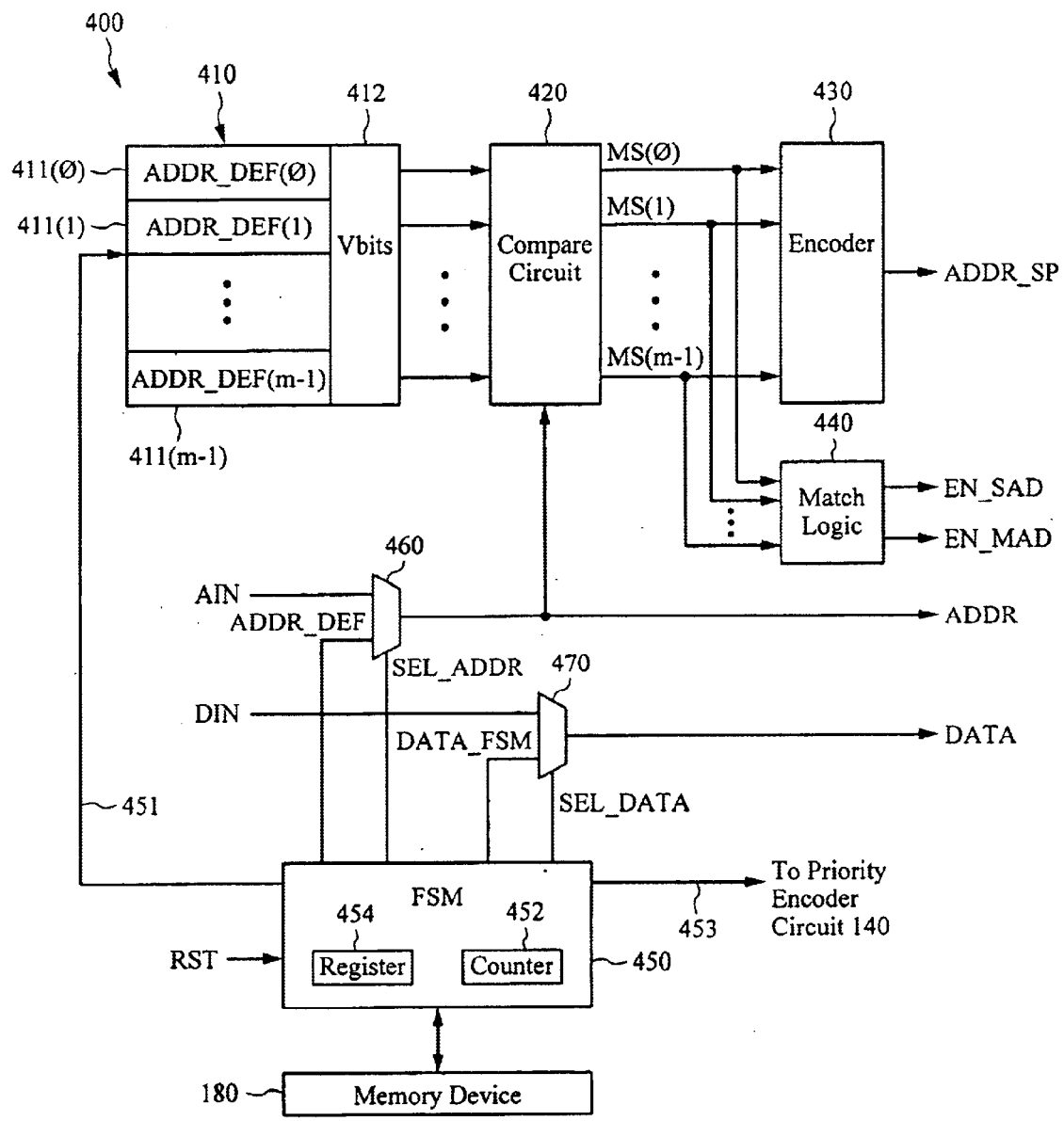
FIG. 4 is a block diagram of one embodiment of the redundancy control circuit of FIG. 1.

FIG. 4 shows a redundancy control circuit 400 that is one embodiment of redundancy control circuit 170 of FIG. 1. Redundancy control circuit 400 includes a defective address table 410, a compare circuit 420, an encoder 430, match logic 440, a finite state machine (FSM) 450, an address multiplexer (MUX) 460, and a data multiplexer (MUX) 470. Table 410, which can be any suitable storage device (e.g., a CAM), has inputs to receive one or more defective addresses and address control signals from FSM 450 via signal lines 451. Table 410 includes a plurality of rows 411(0)–411($m$-1), each for storing the address of a defective row in main CAM array 112 that a corresponding spare row 114 is to functionally replace. For example, row 411(0) of table 410 stores the address ADDR_DEF(0) of a defective row in main CAM array 112 that spare row 114(0) functionally replaces. Each row 411 in table 410 also includes a valid bit 412 that indicates whether the corresponding row 411 stores a valid defective address. For some embodiments, the valid bits 412 stored in table 410 are the disable bits provided by memory element 180. Further, although not shown in FIG. 4 for simplicity, table 410 may include a well-known address decoder that selects one of rows 411 in response to the address control signals provided by FSM 450.

Compare circuit 420, which is well-known, includes first inputs to receive the defective addresses ADDR_DEF(0)–ADDR_DEF($m$-1) from corresponding rows 411 of table 410, a second input to receive ADDR from address MUX 460, and outputs coupled to encoder 430 and to match logic 440. Compare circuit 420 compares ADDR with ADDR_DEF(0)–ADDR_DEF($m$-1) to generate match signals MS(0)–MS($m$-1), respectively, which in turn are used by encoder 430 to generate ADDR_SP and used by match logic 440 to generate EN_SAD and EN_MAD.

Figure 5:
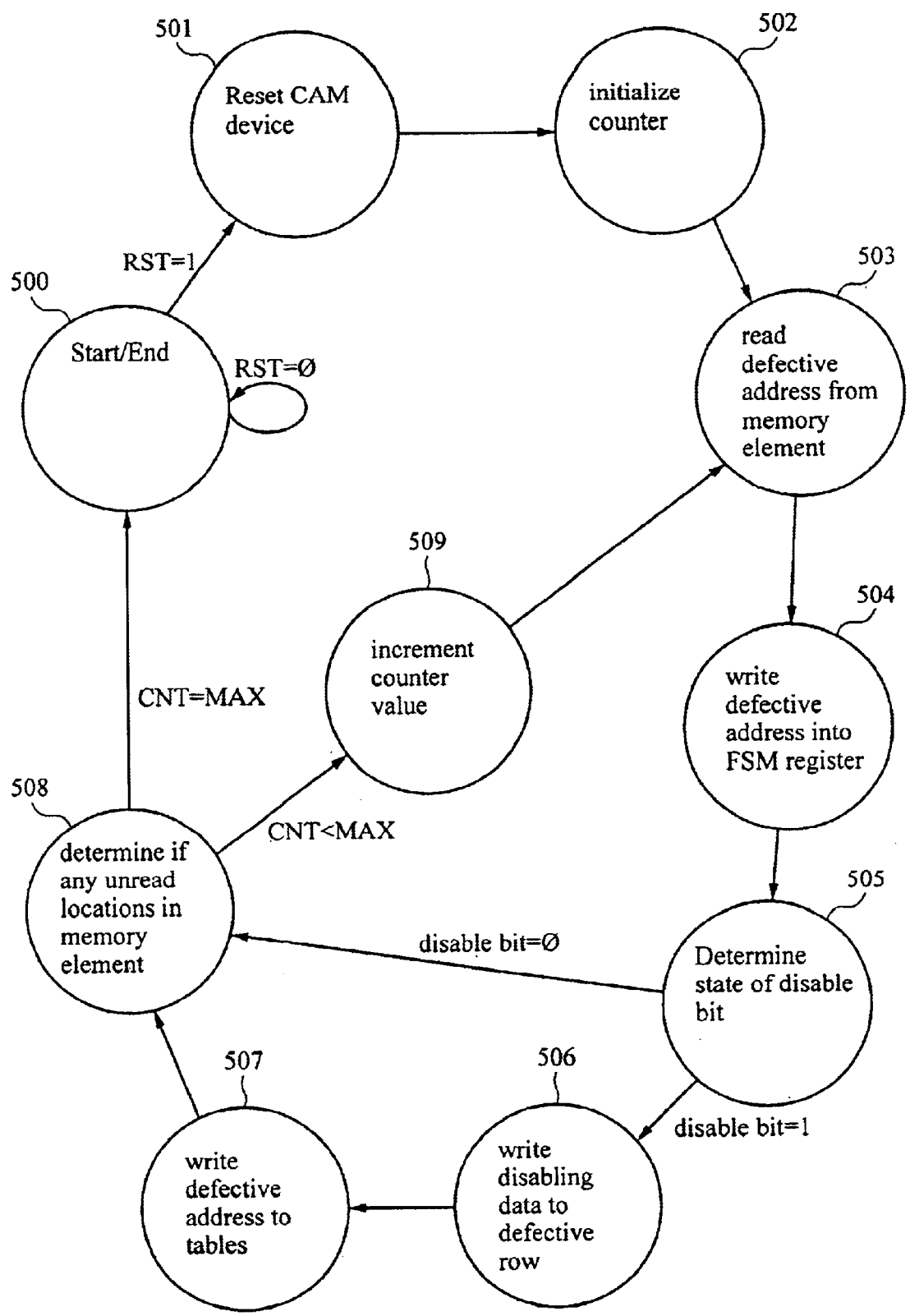
FIG. 5 is a state diagram for an exemplary initialization operation for one embodiment of the CAM device of FIG. 1.

FSM 450 includes any suitable logic or circuitry to implement the state diagram of FIG. 5, as well as a counter 452 and a register 454. Counter 452, which can be any suitable binary counter, stores a count value CNT that can be used to address storage locations in memory element 180. Register 454, which can be any suitable register, can be used to store defective addresses provided by memory element 180. For other embodiments, counter 452 arid/or register 454 can be external to FSM 450. In addition, FSM 450 includes inputs to receive RST and to receive one or more defective addresses from memory element 180, and includes outputs to provide the one or more defective addresses and corresponding address control signals to table 410 via signal lines 451 and to priority encoder circuit 140 via signal lines 453, outputs to provide defective addresses to a first input of address MUX 460, and outputs to provide the disabling data to a first input of data MUX 470. Address MUX 460 includes a second input to receive AIN, a control terminal to receive a select signal SEL_ADDR provided by FSM 450, and an output to provide ADDR to main address decoder 160. Data MUX 470 includes a second input to receive DIN, a control terminal to receive a select signal SEL_DATA provided by FSM 450, and an output to provide DATA to read/write circuit 130.

An exemplary initialization operation for CAM device 100 is described more fully below with reference to the state diagram of FIG. 5. Although not shown in FIGS. 4 and 5, FSM 450 includes a clocking mechanism to clock various signals and/or to transition between states. Upon power-up of CAM device 100, FSM 450 is in the start/end state 500, and awaits assertion of RST. When RST is asserted (e.g., to logic high), FSM 450 transitions to state 501, and CAM device 100 is reset to a known state. The entries in table 410 are reset to a known state, and the spare rows 114 are disabled. For some embodiments, the V-bits 412 in table 410 are used to disable spare rows 114. For other embodiments, disabling data can be written to spare rows 114 to disable spare rows 114. FSM 450 transitions to state 502, and initializes counter 452 to a predetermined value (e.g., CNT= 0). FSM 450 transitions to state 503, and reads the defective address and corresponding disable bit from the storage location in memory element 180 addressed by CNT. FSM 450 transitions to state 504, and writes the defective address ADDR_DEF and the disable bit to register 454.

FSM 450 then transitions to state 505, and determines whether the defective row in main CAM array 112 identified by ADDR_DEF is to be disabled. If the disable bit is de-asserted (e.g., to logic low), FSM 450 does not disable the defective row, and transitions to state 508. Conversely, if the disable bit is asserted (e.g., to logic high), FSM 450 facilitates the functional replacement of the defective row with a corresponding spare row 114 in states 506 and 507.

For example, in state 506, FSM 450 provides ADDR_DEF to address MUX 460, and asserts SEL_ADDR (e.g., to logic high) to cause address MUX 460 to forward ADDR_DEF as the input address ADRR to main address decoder 160, which in turn selects the defective row addressed by ADDR_DEF for a write operation. FSM 450 provides the disabling data as DATA_FSM to data MUX 470, and asserts SEL_DATA (e.g., to logic high) to cause data MUX 470 to forward DATA_FSM as the input data DATA to read/write circuit 130. In response thereto, read/write circuit 130 writes DATA_FSM to the defective row selected by main address decoder 160, thereby disabling the defective row as described above with respect to FIGS. 2 and 3. FSM 450 then transitions to state 507, and writes ADDR_DEF and the disable bit to a corresponding row 411 of table 410. For some embodiments, FSM 450 uses CNT from counter 452 as an address to select the corresponding row 411 in table 410 to store ADDR_DEF and the disable bit. FSM 450 also provides ADDR_DEF to priority encoder circuit 140, as described in more detail below with respect to FIGS. 6 and 7.

FSM 450 then transitions to state 508, and determines whether there are more storage locations in memory element 180 to be read. For one embodiment, FSM 450 compares CNT to a maximum count value MAX to determine if there are any unread locations in memory element 180, where MAX corresponds to the highest numerical address in memory element 180. If there are not any unread locations in memory element 180 (e.g., CNT=MAX), FSM 450 transitions to state 500. Conversely, if there are any unread locations in memory element 180 (e.g., CNT<MAX), FSM 450 transitions to state 509, increments CNT (e.g., to address the next location in memory element 180), and transitions to state 503. FSM 450 repeats states 503–509 for each defective address stored in memory element 180 until each defective row in main CAM array 112 is functionally replaced by a spare row 114.

As mentioned above, spare rows 114 that do not functionally replace defective rows in main CAM array 112 can be disabled by writing the disabling data to one or more of the CAM cells 200 in each unused spare row 114. For some embodiments, FSM 450 facilitates writing the disabling data to unused spare rows 114 using the disable bits stored in memory element 180. Thus, for example, if the disable bit read from the location in memory element 180 addressed by CNT is not asserted, which indicates that the corresponding spare row 114 will not be used to functionally replace a defective row in main CAM array 112, FSM 450 forwards the disabling data as DATA_FSM to read/write circuit 130 and forwards CNT to spare address decoder 150. In response thereto, read/write circuit 130 writes the disabling data to the spare row 114 selected by spare address decoder 150, thereby disabling the unused spare row 114.

For other embodiments, the disable bits stored in memory element 180 and the valid bits 412 stored in table 410 can be eliminated. For such embodiments, state 505 of FSM 450 can be eliminated, with FSM 450 transitioning from state 504 to state 506. For some embodiments, state 507 can precede state 505.

After initializing CAM device 100, FSM 450 de-asserts SEL_ADDR (e.g., to logic low) and de-asserts SEL_DATA (e.g., to logic low). The de-asserted state of SEL_ADDR causes address MUX 460 to forward AIN as ADDR to main address decoder 160. The de-asserted state of SEL_DATA causes data MUX 470 to forward DIN as DATA to read/write circuit 130. Thereafter, read and write operations to defective rows in main CAM array 112 will instead access corresponding spare rows 114.

The above-described functional replacement of defective rows in main CAM array 112 with spare rows 114 can be initiated in response to other operations such as, for example, a repair operation or in response to some other signal provided by a user or tester of CAM device 100.

An exemplary read or write operation for CAM device 100 is performed as follows. AIN is provided as the input address ADDR via address MUX 460 to main address decoder 160 and to compare circuit 420. Compare circuit 420 compares AIN to the defective addresses ADDR_DEF (0)–ADDR_DEF(m-1) stored in corresponding rows 411 of table 410 and, in response thereto, selectively asserts corresponding address match signals MS(0)–MS(m-1). Thus, if AIN matches any of the defective addresses stored in table 410, which indicates that the row addressed by AIN is defective,-compare circuit 420 asserts the corresponding match signal MS (e.g., to logic high). In response thereto, match logic 440 asserts EN_SAD (e.g., to logic high) and de-asserts EN_MAD (e.g., to logic low), and encoder 430 generates the spare address ADDR_SP of a corresponding spare row 114. For example, if AIN matches ADDR_DEF (0) stored in row 411(0) of table 410, compare circuit 420 asserts match signal MS(0), which in turn causes encoder 430 to generate the spare address of spare row 114(0). The asserted state of EN_SAD enables spare address decoder 150, and the de-asserted state of EN_MAD disables main address decoder 160. Spare address decoder 150 decodes ADDR_SP and asserts a corresponding spare word line SWL to select the spare row 114 addressed by ADDR_SP for the read or write operation.

Conversely, if there is not a match between AIN and ADDR_DEF(0)–ADDR_DEF(m-1), which indicates the row addressed by AIN is not defective, compare circuit 420 de-asserts all address match signals MS(0)–MS(m-1). In response thereto, match logic 440 de-asserts EN_SAD (e.g., to logic low) and asserts EN_MAD (e.g., to logic high). The de-asserted state of EN_SAD disables spare address decoder 150, and the asserted state of EN_MAD enables main address decoder 160. In response thereto, main address decoder 160 decodes AIN and asserts a corresponding word line WL to select the row in main CAM array 112 addressed by AIN for the read or write operation.

Note that when spare address decoder 150 is disabled (e.g., when EN_SAD is de-asserted), spare address decoder 150 does not assert spare word lines SWL, thereby de-selecting spare rows 114 for read and write operations. Similarly, when main address decoder 160 is disabled (e.g., when EN_MAD is de-asserted), main address decoder 160 does not assert any word line WL, thereby de-selecting rows in main CAM array 112 for read and write operations.

For some embodiments, compare circuit 420 compares AIN to ADDR_DEF(0)–ADDR_DEF(m-1) to generate respective address match signals MS(0)–MS(m-1) without regard to the valid bits 412 stored in table 410, as described above. For other embodiments, the valid bits 412 are provided from table 410 to compare circuit 420 and included in the comparison with AIN so that only those defective addresses ADDR_DEF(0)–ADDR_DEF(m-1) which have an asserted valid bit 412 can match AIN. For example, compare circuit 420 can compare first input values formed by concatenating the defective addresses ADDR_DEF(0) –ADDR_DEF(m-1) to corresponding valid bits 412 with a second input value formed by concatenating AIN to an asserted valid bit to generate respective address match signals MS(0)–MS(m-1).

Figure 6:
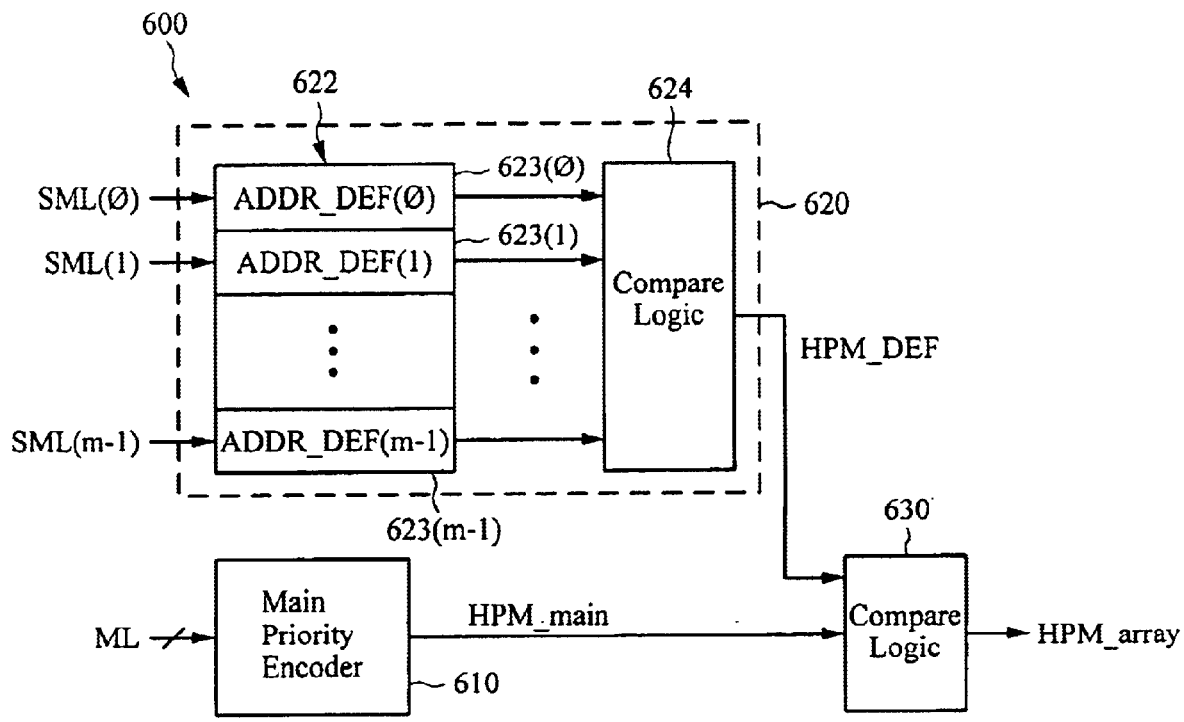
FIG. 6 is a block diagram of one embodiment of the priority encoder circuit of FIG. 1.

FIG. 6 shows a priority encoder circuit 600 that is one embodiment of priority encoder circuit 140 of FIG. 1. Priority encoder circuit 600 includes a main priority encoder 610, a redundancy priority circuit 620, and compare logic 630. Main priority encoder 610 is well-known and, in response to match signals provided by match lines ML from main CAM array 112, determines the index of the highest priority matching entry (HPM_main) in main CAM array 112. For one embodiment, HPM_main is the lowest address value at which a matching entry is stored in main CAM array 112, although in other embodiments priority can be reversed or programmable.

Redundancy priority circuit 620 includes a table 622 and compare logic 624. Table 622, which can be any suitable storage device (e.g., a CAM), includes a plurality of rows 623(0)–623(m-1). Each row 623 of table 622 stores the address of a defective row in main CAM array 112 that is functionally replaced by a corresponding spare row 114, and is coupled to the spare match line SML of the corresponding spare row 114. For example, row 623(0) of table 622 stores the defective address ADDR_DEF(0) for spare row 114(0), and is coupled to spare match line SML(0). Table 622 is configured to selectively output the defective addresses stored in rows 623 in response to match signals on corresponding spare match lines SML. Table 622, which includes a well-known address decoder (not shown for simplicity), can be programmed with defective addresses by FSM 450 in the manner described above with respect to table 410 of FIG.

4, for example, by using CNT as an address control signal to select rows 623 for writing. For some embodiments, tables 410 and 622 are the same table.

Compare logic 624 includes inputs coupled to corresponding rows 623 of table 622, and is configured to compare the defective addresses provided by table 622 with each other to determine which of the matching spare rows 114 functionally replaces the highest-priority defective row, and generates the index of the highest priority matching defective row (HPM_DEF). In one embodiment, table 622 and compare logic 624 may be formed as a priority index table as described, for example, in the co-pending and commonly owned U.S. patent application Ser. No. 09/406,170 entitled "Method and Apparatus for Performing Packet Classification for Policy Based Routing," which is incorporated by reference herein.

For other embodiments, other suitable techniques can be used to resolve priority between the defective addresses including, for example, those techniques described in U.S. Pat. No. 6,275,426, which is referenced above.

Compare logic 630 includes inputs coupled to main priority encoder 610 and to compare logic 624, and is configured to compare HPM_main and HPM_DEF to generate the index of the highest priority match (HPM_array) for the entire CAM array 110. Compare logic 630 is similar to compare logic 624.

Priority encoder circuit 600 generates HPM_array during compare operations as follows. A comparand word is provided to CAM array 110 and compared with entries stored in rows in main CAM array 112 and spare rows 114. For each matching entry in main CAM array 112, the corresponding match line ML is asserted to indicate the match condition. The match signals on match lines ML are used by main priority encoder 610 in a well-known manner to generate HPM_main. Similarly, for each matching entry in spare rows 114, the corresponding spare match line SML is asserted to indicate the match condition. The match signals on spare match lines SML are used by table 622 to selectively output defective addresses stored in corresponding rows 623 to compare logic 624. For example, if spare match line SML(0) is asserted to indicate the match condition, table 622 forwards ADDR_DEF(0) from row 623(0) to compare logic 624. Conversely, if SML(0) is de-asserted to indicate the mismatch condition, table 622 does not forward ADDR_DEF(0) to compare logic 624. Compare logic 624 compares the matching defective addresses provided by table 622 with each other to generate HPM_DEF. Compare logic 630 compares HPM_main with HPM_DEF, and selects the index with the highest priority as HPM_array.

Figure 7:
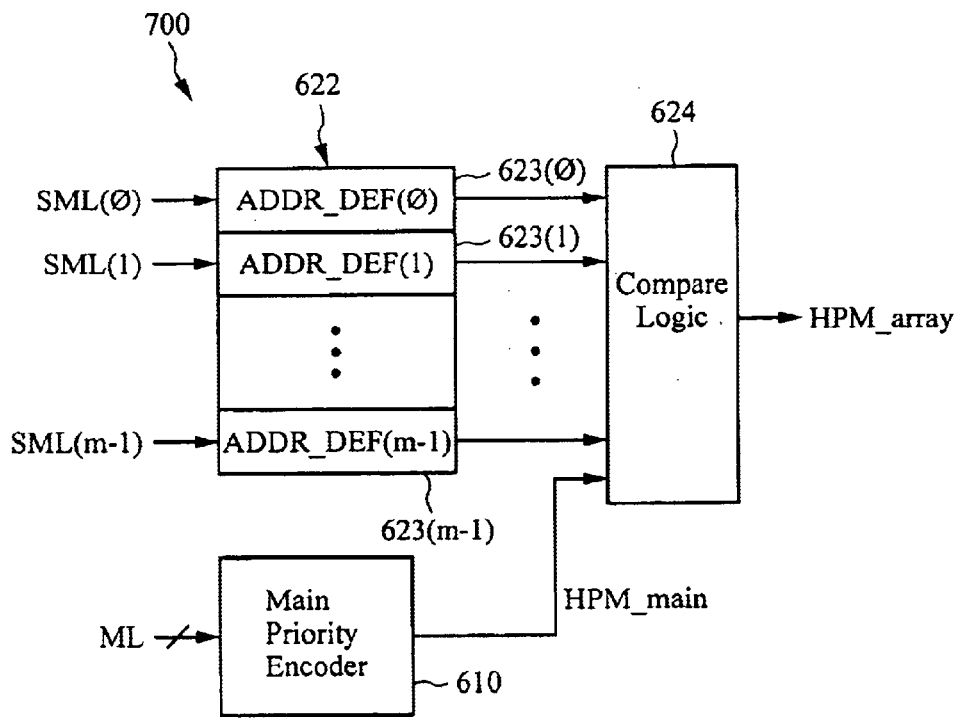
FIG. 7 is a block diagram of another embodiment of the priority encoder circuit of FIG. 1.

For other embodiments, compare logic 630 may be incorporated into compare logic 624 as illustrated, for example, in FIG. 7, where compare logic 624 compares matching defective addresses ADDR_DEF(0)–ADDR_DEF(m-1) provided by table 622 and HPM_main provided by main priority encoder 610 with each other to generate HPM_array.

The priority encoder circuits of FIGS. 6 and 7 are adapted to allow each spare row 114 to replace any defective row in main CAM array 112. Thus, because defective addresses can be stored in tables 410 and 622 in any order, spare rows 114 can be assigned to functionally replace defective rows in main CAM array 112 in any order, irrespective of priority. Accordingly, if a spare row 114 is defective, another available spare row 114 can be used to functionally replace a defective row in main CAM array 112.

In addition, the ability for each spare row 114 to functionally replace any defective row in main CAM array 112 allows defective addresses to be programmed into CAM device 100 at any time after fabrication and testing. Thus, for some embodiments, if a row in main CAM array 112 becomes defective after a period of use by a customer, the customer may program the defective row address into memory element 180 and then assert RST to functionally replace the newly detected defective row in main CAM array 112 with an available spare row 114. In this manner, the customer may repair CAM device 100 long after CAM device 100 is packaged and sold to the customer.

For some embodiments, the defective address entries in table 410 can be accessed and/or loaded directly by another device (or built-in circuitry such as built-in self test "BIST" or JTAG compliant circuitry) connected to CAM device 100. In this manner, the row redundancy features of the present invention can be tested at any time by loading defective addresses into table 410 and then determining whether read and write operations to defective rows in main CAM array 112 instead access corresponding spare rows 114. Table 622 may also be directly accessible to, for example, test the compare operation of replaced rows. Thus, the row redundancy feature of CAM device 100 can be tested before defective addresses are programmed into memory element 180, e.g., without first determining whether any rows in main CAM array 112 are actually defective. Further, by allowing external access to tables 410 and 622, a user can configure or re-configure the replacement of defective rows with spare rows either before or after CAM device 100 is placed in a host system, for example, during a built-in self test operation.

Figure 8:
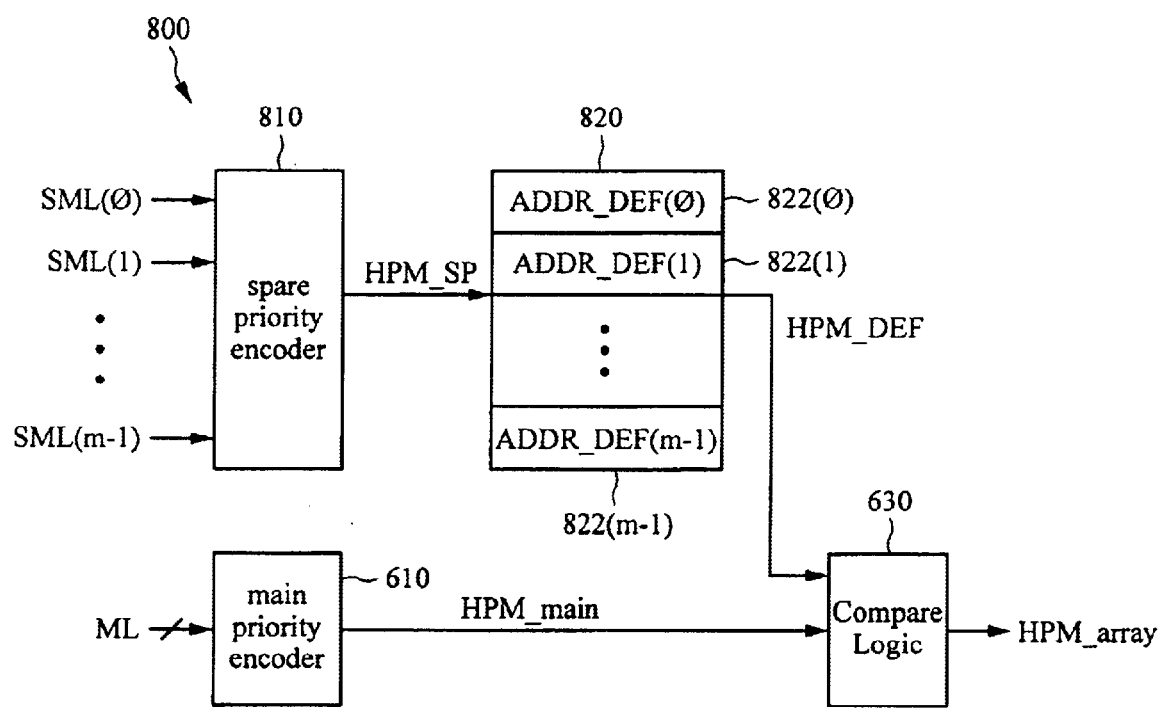
FIG. 8 is a block diagram of yet another embodiment of the priority encoder circuit of FIG. 1.

For other embodiments, CAM device 100 may employ the priority encoder circuit 800 of FIG. 8. Priority encoder circuit 800, which is another embodiment of priority encoder circuit 140 of FIG. 1, includes main priority encoder 610, a spare priority encoder 810, a table 820, and compare logic 630. Main priority encoder generates HPM_main in response to match signals on match lines ML as described above. Spare priority encoder 810 is well-known, and generates the index of the spare row that has the highest priority matching entry (HPM_SP) in response to match signals on spare match lines SML. Table 820 includes a plurality of rows 822(0)–822(m-1), each for storing the address of defective row in main CAM array 112 that is functionally replaced by a corresponding spare row 114. Using HPM_SP as a read address, table 820 outputs the defective address corresponding to HPM_SP as HPM_DEF to compare logic 630. Compare logic 630 compares HPM_DEF and HPM_main to generate HPM_array, as described above with respect to FIG. 6.

For the embodiment of FIG. 8, the spare rows 114 are assigned to replace defective rows in main CAM array 112 according to priority. For example, the spare row 114 having the lowest spare address is selected to functionally replace the defective row in main CAM array 112 having the lowest address, the spare row 114 having the next lowest spare address is selected to functionally replace the defective row in main CAM array 112 having the next lowest address, and so on. Accordingly, the defective addresses stored in tables 410 and 820 are ordered according to priority, which eliminates the need for compare circuit 624 of FIG. 6.

The embodiments described above can be replicated any number of times to form a larger CAM system. For example, referring to FIG. 9, a CAM system 900 in accordance with another embodiment of the present invention is shown to include a plurality of CAM modules 910(0)–910(x) and a system priority encoder 920, as well as the comparand register 130, read/write circuit 140, redundancy control circuit 170, and memory element 180 described above. Referring also to FIG. 1, each CAM module 910 includes a main memory array 112, one or more spare rows 114, a priority encoder circuit 140, match logic 145, a spare address decoder 150, and a main address decoder 160. Each CAM module 910 is coupled to comparand register 120 via comparand lines CL and to read/write circuit 130 via bit lines BL in the manner described above with respect to FIGS. 1–3. For simplicity, the comparand lines CL and bit lines BL are represented collectively in FIG. 9. Operation of the components of each module 910 is described in detail above, and therefore is not repeated here.

CAM system 900 can include any number of CAM modules 910(0)–910(x), and each CAM module 910 can include any number of rows of CAM cells 200 and any number of spare rows 114. For one embodiment, CAM system 900 includes 64 CAM modules 910, each which includes a main CAM array 112 having k=1024 rows of CAM cells 200 and m=8 spare rows 114 of CAM cells 200.

For some embodiments, the first CAM module 910(0) is designated as the highest priority module, the second CAM module 910(1) is designated as the next highest priority module, and so on, and the last CAM module 910(x) is designated as the lowest priority module, although in other embodiments priority may be reversed or otherwise modified. Thus, the highest priority CAM module 910(0) may include the lowest CAM addresses (i.e., CAM addresses 0 to k-1), the next highest priority CAM module 910(1) may include the next lowest CAM addresses (i.e., CAM addresses k to 2k-1), and so on, and the lowest priority CAM module 910(x) may include the highest CAM addresses (i.e., CAM addresses (x-1)k to xk-1).

Figure 9:
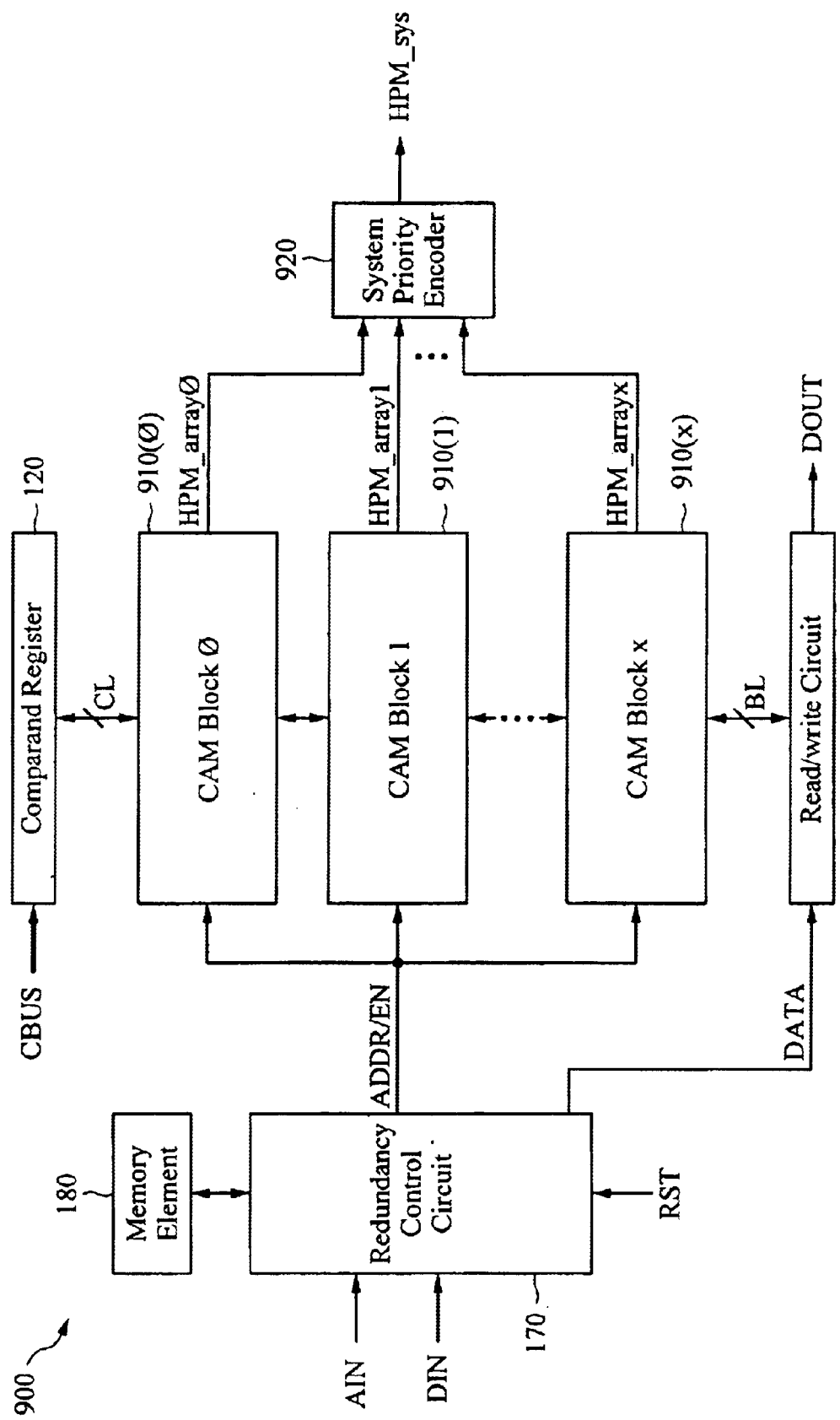
FIG. 9 is a block diagram of a CAM system in accordance with another embodiment of the present invention.

For embodiments of FIG. 9, redundancy control circuit 170 stores the defective addresses for CAM modules 910(0)–910(x) and, for each CAM module 910, facilitates the functional replacement of defective rows in the module's main CAM array 112 with the module's spare rows 114 in the manner described above. For some embodiments, control circuit 170 includes a plurality of groups of tables 410(0)–410(x), compare circuits 420(0)–420 (x), encoders 430(0)–430(x), and match logic 440(0)–440(x), with each group controlling the row replacement for a corresponding CAM module 910(0)–910(x) during read and write operations. For other embodiments, a single table 410, a single compare circuit 420, a single encoder 430, and a single match logic 440 can be used to control the row replacement for all CAM modules 910(0)–910(x)

System priority encoder 920 is well-known, and combines the array indices HPM_array_0 to HPM_array_x provided by CAM modules 910(0)–910(x), respectively, to generate an HPM index for CAM system 900 (HPM_sys). System priority encoder 920 can also monitor the validity bits from the main array 112 in each module 900 to generate the NFA for system 900. Further, although not shown for simplicity, CAM system 900 includes a system match logic that combines the match flags provided by modules 910(0)–910(x) to generate a system match flag and a system multiple match flag. The system match logic can also monitor the validity bits and/or full flags provided by CAM modules 910(0)–910(x) to generate a system full flag.

CAM system 900 is tested for defects in the manner described above, and the addresses of rows having one or more defective CAM cells are programmed into memory element 180. Upon power-up or a reset operation, redundancy control circuit 170 writes the disabling data to the defective rows identified by the defective addresses read from memory element 180, and then writes the defective addresses to tables 410 and 622 corresponding to each module 910 (see also FIGS. 4 and 6). Thereafter, read and write operations to the defective rows will instead access corresponding spare rows 114. For compare operations, each CAM module 910 generates a corresponding HPM index for its array (e.g., HPM_array_0) in the manner described above with respect to FIGS. 6–8. The indices HPM_array_0 to HPM_array_x are combined in system priority encoder 920 to generate the system HPM index in well-known manner.

Figure 10:
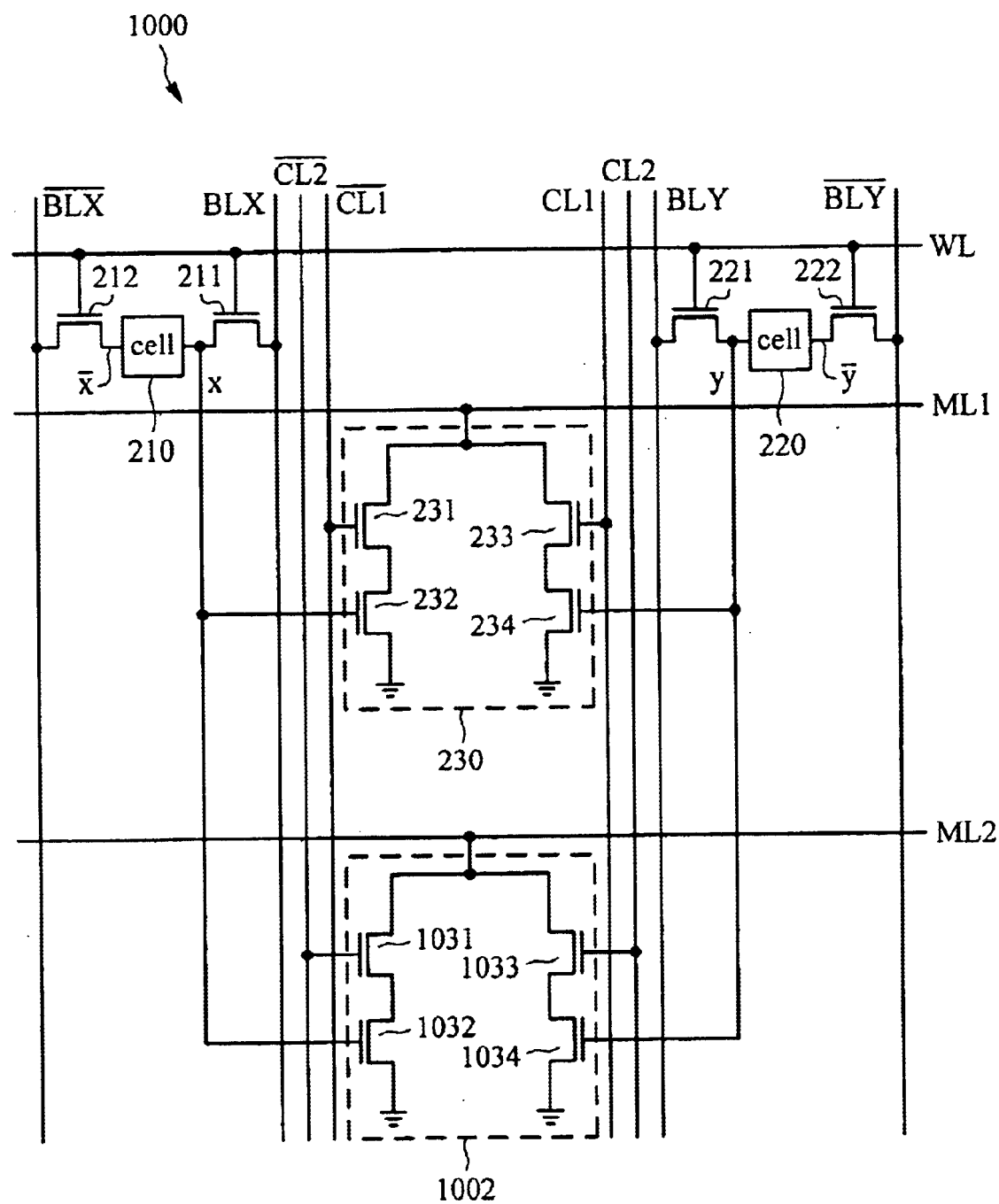
FIG. 10 is a circuit diagram of another embodiment of the CAM cells employed in the CAM devices of FIGS. 1 and/or 9.

For other embodiments, CAM devices in accordance with the present invention can include quaternary CAM cells modified to allow multiple compare operations to be performed simultaneously. For example, FIG. 10 shows a CAM cell 1000 that can be used in CAM array 110 for CAM device 100 and in CAM arrays 112 for CAM system 900. CAM cell 1000, which includes all the elements of CAM cell 200 of FIG. 2, is modified to include a second compare circuit 1002. Compare circuit 1002, which is similar to compare circuit 230, includes NMOS transistor pairs 1031–1032 and 1033–1034 coupled in series between a second match line ML2 and ground potential. The gate of transistor 1033 is coupled to a second comparand line CL2, the gate of transistor 1034 is responsive to Y, the gate of transistor 1031 is coupled to a second complementary comparand line $\overline{CL2}$, and the gate of transistor 1032 is responsive to X.

Read and write operations for embodiments using CAM cells 1000 are identical to those described above with respect to CAM cell 200. For compare operations, two sets of comparand data can be compared with data stored in rows of CAM cells 1000 at the same time. For example, first comparand data is supplied on first comparand line pair CL1/$\overline{CL1}$ and compared with data stored in cells 210/220 using compare circuit 230 to generate match results on first match line ML1, and second comparand data is supplied on second comparand line pair CL2/$\overline{CL2}$ and compared with data stored in cells 210/220 using compare circuit 1000 to generate match results on second match line ML2. For some embodiments, the first and second match results are provided to separate priority encoder circuits (e.g., priority encoder circuit 140) to simultaneously generate two corresponding HPM indices. For other embodiments, the first and second match results are multiplexed into one priority encoder circuit that alternately outputs HPM indices for the first and second comparand data results. Additional information for performing multiple search operations in a CAM device can be found in commonly owned U.S. Pat. No. 6,137,707 entitled "Method and Apparatus for Simultaneously Performing a Plurality of Compare Operations in Content Addressable Memory Device," which is incorporated by reference herein.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A content addressable memory (CAM) device, comprising:
   a main array having any number of rows, each row including a plurality of CAM cells each of which stores a corresponding bit of a data word stored in the row;
   one or more spare rows of CAM cells; and
   means for functionally replacing a defective row of CAM cells in the main array with one of the spare rows of CAM cells, wherein the means for functionally replacing comprises one or more of the CAM cells in the defective row.

2. The CAM array claim 1, wherein the means for functionally replacing does not include an additional storage element in the defective row.

3. The CAM device of claim 1, wherein each row of CAM cells in the main array is coupled to a corresponding main match line, and each spare row of CAM cells is coupled to a corresponding spare match line.

4. The CAM device of claim 1, wherein one or more of the CAM cells in each row of the main array comprise quaternary CAM cells.

5. The CAM device of claim 4, wherein one or more of the CAM cells in each spare row comprise quaternary CAM cells.

6. The CAM device of claim 4, wherein the means for functionally replacing comprises writing a disabling value of "11" to any number of the quaternary CAM cells in the defective row.

7. The CAM device of claim 1, wherein the means for functionally replacing comprises means for writing disabling data to the defective row.

8. The CAM device of claim 7, wherein the disabling data forces the defective row to a mismatch state during compare operations.

9. The CAM device of claim 7, wherein the means for writing comprises a finite state machine (FSM).

10. The CAM device of claim 9, wherein the means for writing further comprises:
   a data multiplexer having a first input to receive input data, a second input to receive the disabling data from the FSM, a control terminal to receive a data select signal from the FSM, and an output coupled to the main array.

11. The CAM device of claim 10, wherein the means for writing further comprises:
   an address multiplexer having a first input to receive an input address, a second input to receive a defective address from the FSM, a control terminal to receive an address select signal from the FSM, and an output coupled to the main array.

12. The CAM device of claim 11, wherein the means for writing further comprises:
   a spare address decoder coupled to the one or more spare rows and responsive to an enable signal;
   a main address decoder coupled to the main array and responsive to a complement of the enable signal;
   a table having a plurality of rows, each of the rows for storing an address of a defective row that a corresponding spare row is to functionally replace;
   a compare circuit having first inputs coupled to corresponding rows of the table, a second input coupled to the output of the address multiplexer, and outputs to generate address match signals; and
   match logic having inputs responsive to the address match signals, and having an output to generate the enable signal.

13. The CAM device of claim 12, wherein each row in the table includes a valid bit indicating whether the corresponding row stores a valid defective address.

14. The CAM device of claim 12, wherein the table is externally accessible by a user of the CAM device.

15. The CAM device of claim 1, further including a priority encoder circuit to generate the index of the highest priority matching entry in the CAM device, the priority encoder circuit adapted to allow each of the spare rows to functionally replace any of the rows in the main array, regardless of priority.

16. A content addressable memory (CAM) device, comprising:
   a main array having a plurality of rows of quaternary CAM cells;
   one or more spare rows of quaternary CAM cells; and
   means for functionally replacing a defective row of CAM cells in the main array with a spare row of CAM cells, wherein the means for functionally replacing comprises the quaternary CAM cells in the defective row.

17. The CAM device of claim 16, wherein the means for functionally replacing does not include an additional storage element in the defective row.

18. The CAM device of claim 16, wherein one or more of the CAM cells in each spare row comprise quaternary CAM cells.

19. The CAM device of claim 16, wherein means for functionally replacing comprises writing disabling data to the quaternary CAM cells in the defective row.

20. The CAM device of claim 19, wherein the disabling data forces the defective row to a mismatch state during a compare operation.

21. A content addressable memory (CAM) device, comprising:
   a main array having a plurality of rows of quaternary CAM cells;
   one or more spare rows of CAM cells; and
   a row disabling mechanism implemented within one or more of the quaternary CAM cells in each row of the main array.

22. The CAM device of claim 21, further comprising a table for storing addresses of defective rows in the main array, the table capable of being accessed externally.

23. The CAM device of claim 21, wherein one or more of the CAM cells in each spare row comprise quaternary CAM cells.

24. The CAM device of claim 21, wherein the row disabling mechanism does not include storage elements dedicated for disabling the rows of the main array.

25. The CAM device of claim 21, wherein the row disabling mechanism is enabled by writing disabling data to any number of the CAM cells in a selected row.

26. The CAM device of claim 25, wherein the disabling data forces the selected row to a mismatch state during a compare operation.

27. The CAM device of claim 21, wherein each CAM cell in the rows of the main array are configured to either store a corresponding bit of a data word to be compared with a search key during compare operations or to store disabling data that disables the row during compare operations.

28. A content addressable memory (CAM) device, comprising:
   a main array having a plurality of rows of quaternary CAM cells; and
   one or more spare rows of CAM cells, each of the spare rows selectable to functionally replace a defective row of quaternary CAM cells in the main array,
   wherein one or more of the quaternary CAM cells in each row of the main array are configured to implement a row disabling mechanism.

29. The CAM device of claim 28, further comprising a table for storing addresses of defective rows in the main array, the table capable of being accessed externally.

30. The CAM device of claim 28, wherein one or more of the CAM cells in the spare rows comprise quaternary CAM cells.

31. The CAM device of claim 28, wherein the row disabling mechanism does not include storage elements dedicated for disabling the rows of the main array.

32. The CAM device of claim 28, wherein the row disabling mechanism is enabled by writing disabling data to any number of the CAM cells in a selected row.

33. The CAM device of claim 32, wherein the disabling data forces the selected row to a mismatch state during a compare operation.

34. The CAM device of claim 28, wherein each CAM cell in the rows of the main array are configured to either store data to be compared with a search key during compare operations or to store disabling data that disables the row during compare operations.

35. A content addressable memory (CAM) system having a plurality of interconnected CAM modules, each comprising:
- a plurality of main rows of quaternary CAM cells, each coupled to a word line and to a match line;
- one or more spare rows of quaternary CAM cells, each coupled to a spare word line and to a spate match line; and
- means for functionally replacing a defective main row of CAM cells with one of the spare rows of CAM cells, wherein the means for functionally replacing comprises writing a disabling value of "11" to any number of the quaternary CAM cells in the defective row.

36. The CAM system of claim 35, wherein the disabling value forces the defective row to a mismatch state during compare operations.

37. The CAM system of claim 35, wherein the means for functionally replacing comprises a row disabling mechanism implemented within the quaternary CAM cells.

38. The CAM system of claim 35, wherein the row disabling mechanism is enabled by writing disabling data to any number of the CAM cells in the defective row.

39. A method of functionally replacing a defective row of quaternary content addressable memory (CAM) cells in a CAM array with a spare row of CAM cells, comprising:
- storing disabling data in the defective row of CAM cells to disable the defective row; and
- enabling the spare row of CAM cells.

40. The method of claim 39, wherein storing the disabling data comprises:
- writing a "11" value to at least one quaternary CAM cell in the defective row.

41. The method of claim 39, wherein storing the disabling data comprises:
- writing a "11" value to every quaternary CAM cell in the defective row.

42. The method of claim 39, wherein the disabling data forces the defective row to a mismatch condition during compare operations.

43. The method of claim 39, wherein enabling the spare row comprises:
- not writing the disabling data to the spare row.

44. The method of claim 39, further comprising:
- writing the disabling data to the CAM cells in the spare row to disable the spare row.

45. A method of functionally replacing a defective row of content addressable memory (CAM) cells in a CAM array with a spare row of CAM cells, comprising:
- storing disabling data in each CAM cell in the defective row to disable the defective row; and
- enabling the spare row of CAM cells.

46. The method of claim 45, wherein storing the disabling data comprises:
- writing a "11" value to the CAM cells in the defective row.

47. The method of claim 45, wherein the CAM cells comprise quaternary CAM cells.

48. The method of claim 45, wherein the disabling data forces the defective row to a mismatch condition during compare operations.

49. The method of claim 45, wherein enabling the spare row comprises:
- not writing the disabling data to the spare row.

50. The method of claim 45, further comprising:
- writing the disabling data to the CAM cells in the spare row to disable the spare row.

* * * * *